(12) United States Patent
Akai

(10) Patent No.: US 6,828,676 B2
(45) Date of Patent: Dec. 7, 2004

(54) SEMICONDUCTOR DEVICE MANUFACTURING METHOD, SEMICONDUCTOR DEVICE, AND SEMICONDUCTOR DEVICE UNIT

(75) Inventor: Takao Akai, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 91 days.

(21) Appl. No.: 10/291,497

(22) Filed: Nov. 12, 2002

(65) Prior Publication Data

US 2003/0230800 A1 Dec. 18, 2003

(30) Foreign Application Priority Data

May 28, 2002 (JP) ........................................ 2002-153863

(51) Int. Cl.⁷ .............................................. H01L 23/34
(52) U.S. Cl. ...................... 257/720; 257/717; 257/704; 257/778
(58) Field of Search ............................... 257/704, 720, 257/778, 717, 706

(56) References Cited

U.S. PATENT DOCUMENTS 5,122,858 A * 6/1992 Mahulikar et al. .......... 257/753
5,409,865 A * 4/1995 Karnezos ..................... 29/827
5,585,671 A * 12/1996 Nagesh et al. ............... 257/697
5,909,057 A * 6/1999 McCormick et al. ........ 257/704
5,973,389 A * 10/1999 Culnane et al. ............. 257/678
6,250,127 B1 * 6/2001 Polese et al. ................. 72/256

FOREIGN PATENT DOCUMENTS

JP          02106477 A      4/1995

* cited by examiner

Primary Examiner—Michael Trinh
(74) Attorney, Agent, or Firm—Staas & Halsey LLP

(57) ABSTRACT

The present invention relates to a manufacturing method of a semiconductor device having a lid implemented on a semiconductor chip. The semiconductor device and the semiconductor device unit are capable of maintaining high thermal dissipation efficiency as well as the semiconductor chip having improved reliability. Specifically, upon manufacturing the above semiconductor device having a semiconductor chip mounted on a substrate and a lid thermally connected to this semiconductor chip, a stiffener, which controls the deformation of the semiconductor chip, is implemented on the side of the semiconductor chip that accommodates the lid; after which heating is performed so as to bond the semiconductor chip accommodating the stiffener to the substrate; followed by the bonding of the lid to the stiffener.

6 Claims, 6 Drawing Sheets

SEMICONDUCTOR DEVICE MANUFACTURING METHOD, SEMICONDUCTOR DEVICE, AND SEMICONDUCTOR DEVICE UNIT

BACKGROUND OF THE INVENTION

1. Field of the Invention

The present invention generally relates to a semiconductor device manufacturing method, a semiconductor device, and a semiconductor device unit, and particularly to a manufacturing method of a semiconductor device having a structure in which a lid is implemented on a semiconductor chip, a semiconductor device, and a semiconductor device unit.

2. Description of the Related Art

With the high-level densification of the semiconductor device in recent years, there is a growing tendency towards an increase in heat generated by the semiconductor chip. In response, a lid is implemented on the semiconductor chip in order to efficiently cool the semiconductor chip.

On the other hand, high reliability is also demanded in a semiconductor device. Thus, the desired semiconductor device is a highly reliable semiconductor device that is provided with a lid but does not suffer stress or separation in between said lid and the semiconductor chip.

The semiconductor of the BGA (Ball Grid Array) type having a structure in which a semiconductor chip is mounted on a substrate and external terminals such as solder balls are implemented on the surface opposite the surface that accommodates the semiconductor chip, is well-know in the conventional art. Also, in response to the increase in the heat generation of the semiconductor chip due to the speed-up and high-level densification of the semiconductor chip, a semiconductor device with a lid for efficient thermal dissipation implemented on the upper portion of the semiconductor chip is provided in the conventional art.

FIG. 1 and FIG. 2 show the above-described semiconductor device according to the conventional art. The semiconductor device 1A shown in FIG. 1 has a semiconductor chip 2 mounted on the upper surface of a multi-layered resin substrate 3 and solder balls 4, which are the external terminals, implemented on the lower surface of the substrate 3.

The semiconductor chip 2 is provided with bumps 6 and is bonded to the substrate 3 through flip chip bonding. Also, in order to strengthen the bonding between the semiconductor chip 2 and the substrate 3, an under fill material 7 is placed in between the semiconductor chip 2 and the substrate 3.

Lid 5A is, for example, made of metal, which has high thermal conductivity. In the conventional art, this lid 5A is bonded directly onto the upper surface of the semiconductor chip 2 using bonding material 8.

On the other hand, the semiconductor device 1B shown in FIG. 2 has a lid 5B with a protrusion 9 at its center portion. By providing the protrusion 9 on the lid 5B, the distance between the substrate 3 and the lid 5B can be augmented so that other electronic components such as a condenser (not shown in the drawing) can be implemented between the substrate 3 and the lid 5B.

Also, in the semiconductor device 1B shown in FIG. 2, a frame 10, supporting the lid 5B, is placed on the outer perimeter of the substrate 3. By providing the frame 10, the lid receives support not only from the semiconductor chip 2 but also from this frame 10 so that the load applied to the semiconductor chip can be reduced.

As mentioned above, the substrate 3 forming the semiconductor device 1A and 1B is a resin substrate, and the semiconductor chip 2 is made of semiconductor material such as silicon. Therefore, the coefficient of thermal expansion of the semiconductor chip 2 and the substrate 3 are different. Also, upon the flip chip bonding of the semiconductor chip 2 to the substrate 3, a heating process is performed on the bumps 6 for melting said bumps 6, and in the heating process for the flip chip bonding, the heat also ends up being applied to the semiconductor chip 2 and the substrate 3. Thus, warping occurs in the semiconductor chip 2 due to the difference in the coefficient of thermal expansion between the semiconductor chip 2 and the substrate 3.

A description of the problem arising from bonding the lid 5A to the above-described warped semiconductor chip 2 is given with reference to FIG. 3. As previously mentioned, in the conventional art the lid 5A is directly bonded to the semiconductor chip 2 using bonding material 8. Thermosetting resin is normally used as the bonding material 8, and a curing process (heating process) is performed upon the bonding.

When the curing process is performed upon the bonding of the lid 5A as described above, the semiconductor chip 2 is re-straightened from its warped form. Specifically, the semiconductor chip 2 attempts to change shape from its warped state (the state shown in FIG. 3) to the position (shape) indicated by the chain line A shown in the same drawing.

Since the bonding material 8 is placed in between the semiconductor chip 2 and the lid 5A, a compression force from the above described changing of shape of the semiconductor chip 2 works on the outer portion of the bonding material 8 (referred to as outer perimeter bonding portion 8A hereinafter). Additionally, a stretching force works on the inner portion of the bonding material 8 (referred to as inner perimeter bonding portion 8B hereinafter).

When differing forces work in the bonding material 8 upon the bonding of the semiconductor chip 2 and the lid 5A as described above, internal stress and voids may be generated therefrom. When internal stress is generated in the bonding material 8, cracks can be formed in the areas where the internal stress is generated.

Also, when voids are formed within the bonding material 8, a fissure may occur in the bonding material, or in the worst case the lid 5A may be separated from the semiconductor chip. This problem can be slightly ameliorated by making the bonding material 8 thicker; however, this also lowers the thermal conductivity of the bonding material layer 8 thereby causing a decrease in thermal dissipation efficiency with regard to the semiconductor chip 2.

SUMMARY OF THE INVENTION

The present invention has been developed in response to the above-described problems, and its object is to provide a semiconductor device manufacturing method, a semiconductor device, and a semiconductor device unit, capable of maintaining high thermal dissipation efficiency of the semiconductor device as well as improving its reliability.

To this end, the present invention resorts to each of the following measures.

First, the present invention provides a manufacturing method of a semiconductor device having a semiconductor chip mounted on a substrate, and a lid thermally connected to said semiconductor chip, the method including steps of:

implementing a stiffener, which prevents the deformation of the semiconductor chip, on the side of the semiconductor chip that accommodates the lid;

bonding the semiconductor chip accommodating the stiffener to the substrate through heating; and, bonding the stiffener to the lid with a bonding material after bonding the semiconductor chip accommodating the stiffener to the substrate.

Preferably, the stiffener is selected from a material that has substantially the same coefficient of thermal expansion as that of the semiconductor chip.

Second, the present invention provides a semiconductor device having a semiconductor chip provided with bumps, a stiffener bonded to the semiconductor chip by a first bonding material and preventing the deformation of the semiconductor chip, a substrate on which the semiconductor chip is mounted via the bumps, and a lid bonded to said stiffener with a second bonding material, wherein the relation between the melting point of the first bonding material denoted as T1, the melting point of the bumps denoted as Tb, and the melting point of the second bonding material denoted as T2 can be described as T1>Tb>T2.

Preferably, the stiffener is made of material that has substantially the same coefficient of thermal expansion as that of said semiconductor chip.

Third, the present invention provides a semiconductor device unit comprising a motherboard on top of which a plurality of the above semiconductor devices each having a semiconductor chip provided with bumps, a stiffener bonded to the semiconductor chip by a first bonding material and preventing the deformation of the semiconductor chip, a substrate on which the semiconductor is mounted via the bumps, and a lid bonded to said stiffener with a second bonding material is implemented.

Additionally, each of the above-described inventions produces the following effects.

According to the semiconductor device manufacturing method of the present invention, a semiconductor chip, provided with a stiffener, which prevents the deformation of the semiconductor chip, is bonded to a substrate so that warping does not occur in the semiconductor chip upon the bonding process. Thus, upon the bonding of the lid, the lid can be bonded to a stiffener that is not warped, and this prevents internal stress or voids from being generated in the bonding material placed between the lid and the stiffener. In consequence, the lid and the stiffener can be securely bonded and the reliability of the manufactured semiconductor device can be improved.

Also, since internal stress and voids are prevented from being generated in the bonding material connecting the lid and the stiffener, the bonding material can be made thinner. Thus, the thermal conductivity of the bonding material layer can be raised and the heat generated in the semiconductor chip can be efficiently transferred through the stiffener and the bonding material.

Additionally, the stiffener is selected from a material that has substantially the same coefficient of thermal expansion as that of the semiconductor chip so that deformation such as warping upon heat application can be prevented from occurring in either the stiffener or the semiconductor chip, or in both of these elements due to the difference in the thermal expansion rate between the stiffener and the semiconductor chip. In consequence, the stiffener and the lid can be securely bonded and the reliability of the manufactured semiconductor device can be improved.

Also, in the semiconductor device according to the present invention, the relation between the melting point of the first bonding material T1, the melting point of the bumps Tb, and the melting point of the second bonding material T2 is arranged to be T1>Tb>T2; thus, the first bonding material and the bumps will not melt upon the bonding of the lid to the stiffener with the second bonding material. Also, the first bonding material will not melt upon the bonding of the semiconductor chip to the substrate via the bumps. Thus, when the semiconductor chip is bonded to the substrate and to the lid, the stiffener is securely bonded to the semiconductor chip by the first bonding material so that deformation such as warping will not occur in the semiconductor chip and the reliability of the semiconductor device can be increased.

Also, in the semiconductor device unit according to the present invention, a plurality of the semiconductor devices each having a semiconductor chip provided with bumps, a stiffener bonded to the semiconductor chip by a first bonding material and preventing the deformation of the semiconductor chip, a substrate on which the semiconductor is mounted via the bumps, and a lid bonded to said stiffener with a second bonding material are implemented on a motherboard, thereby realizing a multi-chip module with excellent heat dissipation characteristics as well as high reliability.

Additionally, in the present invention, the stiffener may be structured to have a concave portion into which a portion of the semiconductor chip is inserted. In this way, the positioning of the semiconductor chip and the stiffener can be easily determined, and the bonded area between the semiconductor chip and the stiffener is increased, thereby strengthening the bonding between these two elements.

Also, the stiffener may have chamfers formed at its corners. The chamfered portions of the stiffener are positioned at the corners of the semiconductor chip where stress is likely to be concentrated, and the stress can be prevented from concentrating on the bonding material situated in these areas. Particularly, this prevents damage such as cracks from occurring in the bonding material situated around the corners of the semiconductor chip and the lid.

Further, the stiffener may be structured to have a plurality of stiffener layers. In this way, the characteristics of the stiffener may vary for each layer so that, for example, a stiffener layer having characteristics that are close to those of the semiconductor chip can be selected for the stiffener layer implemented on the semiconductor chip side and a stiffener layer having characteristics that are close to those of the lid can be selected for the stiffener layer implemented on the lid side. Thus, the stiffener can strengthen the bonding between the semiconductor chip and the lid and deformation such as warping can be controlled.

DESCRIPTION OF THE PREFERRED EMBODIMENTS

In the following, a description of the preferred embodiment of the present invention is given with reference to the accompanying drawings.

Figure 4:
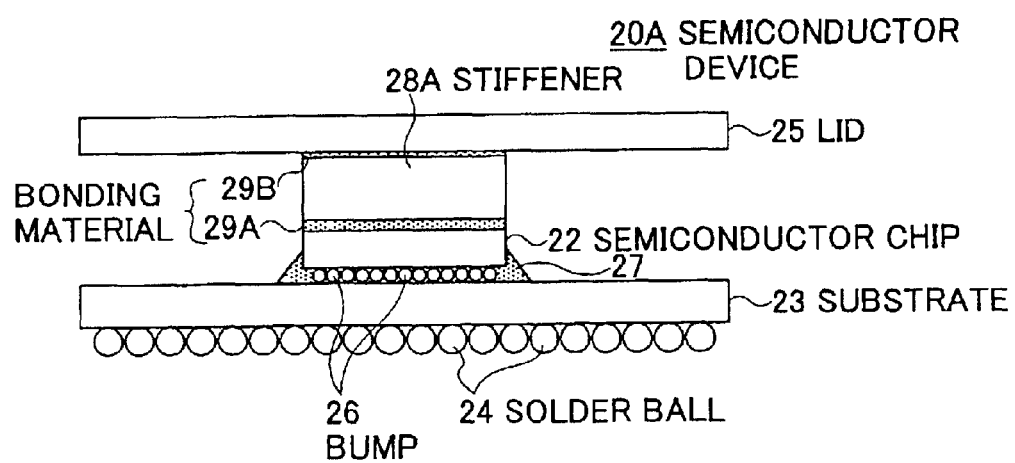
FIG. 4 shows a semiconductor device according to an embodiment of the present invention.
Figure 5:
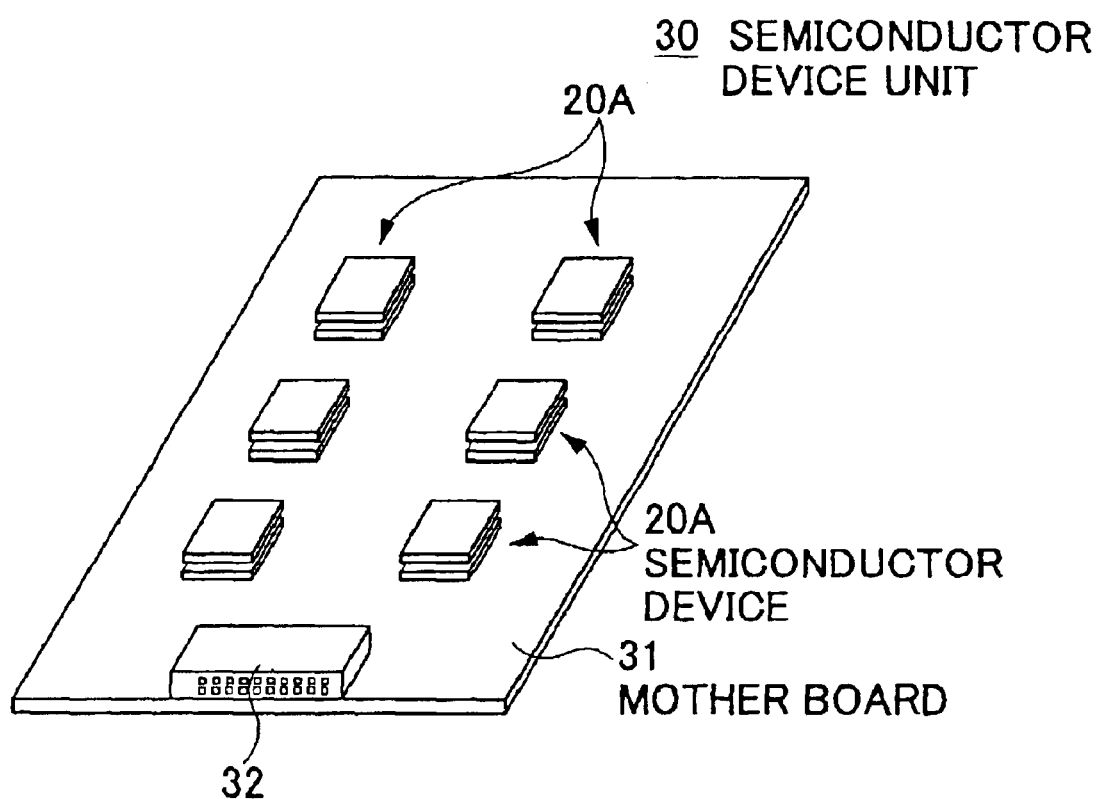
FIG. 5 shows a semiconductor device unit implementing the semiconductor devices according to the embodiment of the present invention.

FIG. 4 shows a semiconductor device 20A according to an embodiment of the present invention, and FIG. 5 shows a semiconductor device unit 30 that implements the semiconductor device 20A of FIG. 4. The semiconductor device 20A shown in FIG. 4 is roughly composed of a semiconductor chip 22, a substrate 23, a lid 25, a stiffener 28A, etc.

The semiconductor chip 22 is a highly densified semiconductor chip that has a circuit formation surface (the lower surface in the drawing) provided with a plurality of bumps 26. In the embodiment solder balls are used as these bumps.

The substrate 23 is a multi-layer wiring substrate and thus comprises a plurality of conductor wiring layers. Each of the conductor wiring layers comprises a wiring membrane whose base material is an insulating resin, and the conductor wiring layers are electrically connected to each other via inter-layer wiring (e.g. conductor via).

Also, a bump bonding pad (not shown) is formed on the chip mounting surface (the upper surface in the drawing) of the substrate 23 on which the semiconductor chip 22 is mounted, and an external connection pad (not shown) is formed on the mount surface opposite to the chip mounting surface (the lower surface in the drawing). The bumps 26 implemented on the semiconductor chip 22 are bonded to the above-mentioned bump bonding pad. Also, the solder balls 24, which are the external connection terminals, are bonded to the external connection pad. Here, a multi-layer wiring substrate having a plurality of conductor wiring layers can be used as the substrate 23 as described above, thereby allowing greater flexibility in the wiring design and fan out, as well as a narrower pitch in the bump bonding pad (i.e. bumps 26).

The semiconductor chip 22 is mounted on the substrate 23 having the above-described structure using the flip chip bonding technique. Thus, the semiconductor chip 22 and the substrate 23 are electrically connected.

Also, an under fill material 27 is implemented in between the semiconductor chip 22 and the substrate 23. The function of this under fill 27 is to mitigate the stress applied to the bumps 26.

The solder balls 24 function as external connection terminals as described above, and are bonded to the substrate 23 using, for example, the transfer method. Thus, the semiconductor chip 22 is electrically connected to the solder balls 24 via the substrate 23.

The semiconductor chip 22 having the stiffener 28A on its top surface further has the lid 25 bonded on top of the stiffener 28A with the second bonding material 29B in between. The lid 25 has the function of dissipating the heat generated at the semiconductor chip 22 and transmitted via the stiffener 28A. Thus, the stiffener 28A is made of metallic material which has high thermal conductivity (e.g. aluminum). It should be noted that although in the present embodiment the lid 25 is illustrated as being board-shaped, the lid 25 can also be structured to have fins so as to further enhance its heat dissipation characteristics.

As shown in FIG. 4, the stiffener 28A is a member placed in between the semiconductor chip 22 and the lid 25. This stiffener 28A is made of ceramic material (e.g. BN, SiC, BeO, ALN), composite material (e.g. ALC, CW), metallic material (e.g. Cu, W, Mo, etc.), or some other material (e.g. Si, diamond). It is desirable that a material having substantially the same coefficient of thermal expansion as that of the semiconductor chip 22 be selected as the material of the stiffener 28A.

In the present invention, 'substantially the same coefficient of thermal expansion' is defined as follows. Namely, the semiconductor chip 22 and the stiffener 28A have 'substantially the same coefficient of thermal expansion' when deformation such as warping, as a result of the difference in the coefficient of thermal expansion of the two elements, does not occur in either the semiconductor chip 22 or the stiffener 28A upon the bonding of the semiconductor chip 22 and the stiffener 28A using the first bonding material 29A.

As described above, by selecting for the material of the stiffener 28A, a material that has substantially the same coefficient of thermal expansion as that of the semiconductor chip 22, deformation such as warping, which occurs in either the stiffener or the semiconductor chip or in both of these elements due to a difference in thermal expansion between the stiffener 28A and the semiconductor chip 22 upon the heating process for bonding the stiffener 28A to the semiconductor chip 22, can be thwarted. In consequence, the stiffener 28A and the lid 25 can be securely bonded (since the semiconductor chip 22 and the stiffener 28A are not deformed) and the reliability of the semiconductor device 20A can be increased.

Also, by constructing a semiconductor device unit 30 so as to have a plurality of the semiconductor devices 20A implemented on a motherboard 31, as shown in FIG. 5, a multi-chip module having excellent heat dissipation characteristics as well as high reliability can be realized. Note that connector 32 in FIG. 5 is a connector for connecting the motherboard 31 to external devices.

Now, the manufacturing method of the semiconductor device 20A of FIG. 4 will be described. FIG. 6 illustrates the procedures in manufacturing the semiconductor device 20A.

Figure 6A:
FIG. 6 is a diagram for illustrating the manufacturing method of the semiconductor device according to the embodiment of the present invention.

First, in order to manufacture the semiconductor device 20A, the first bonding material 29A is placed on the semiconductor chip 22, as shown in FIG. 6(A). Bumps 26 are implemented on the other side of the semiconductor chip 22 from the beginning.

The above bumps 26 are solder balls and are implemented at the electrodes of the semiconductor chip 22 using, for example, the transfer method. Also, the first bonding material 29A is, for example, made of epoxy resin or metal with a low melting point (e.g. low-melting-point solder). In the following description, the melting point of the solder making up the bumps 26 is denoted as Tb, and the melting point of the first bonding material 29A is denoted as T1.

After the bonding material 29A is implemented on the surface of the semiconductor chip 22 as described above, the stiffener 28A is then bonded to the semiconductor chip 22. As previously mentioned, the stiffener 28A has the same coefficient of thermal expansion as that of the semiconductor chip 22, and has a higher rigidity with respect to the semiconductor chip 22. Thus, the stiffener 28A functions as a stiffening material for strengthening the semiconductor chip 22.

Figure 6B:
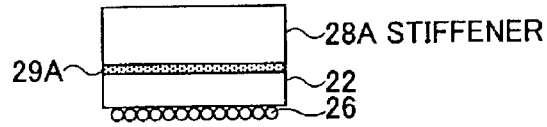

The bonding of the semiconductor chip 22 and the stiffener 28A is performed through use of the first bonding material 29A. In the bonding process, the semiconductor chip 22 and the stiffener 28A are heated up to the melting temperature T1, and thus, the first bonding material 29A is melted so as to bond the semiconductor chip 22 and the stiffener 28A. FIG. 6(B) illustrates the state in which the semiconductor chip 22 and the stiffener 28A are bonded together by the first bonding material 29A.

After the bonding process of the semiconductor chip 22 and the stiffener 28A, the semiconductor chip 22 is bonded to the substrate 23. The bonding of the semiconductor chip 22 to the substrate 23 is performed using the flip chip bonding method.

Namely, the semiconductor chip 22 is bonded to the substrate 23 face-down in an environment where the temperature is raised to the melting temperature Tb of the bumps 26. During the process of bonding the semiconductor chip 22 to the substrate 23, the semiconductor chip 22 is supported by the stiffener 28A. In other words, the stiffener 28A has a higher rigidity than the semiconductor chip 22.

Figure 6C:
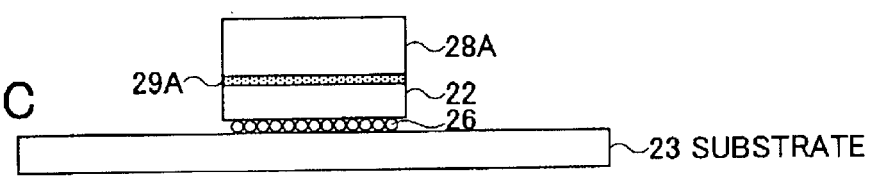

Also, the degree of rigidity in the stiffener 28A is determined by the rigidity needed in order to thwart the force working to deform the semiconductor chip 22, caused by the difference in the thermal expansion rate between the semiconductor chip 22 and the substrate 23. FIG. 6(C) shows the state in which the semiconductor chip 22 and the substrate 23 are bonded. As shown in the drawing, no deformation such as warping occurs in the semiconductor chip 22 when the semiconductor chip 22 is bonded to the substrate 23.

Figure 6D:
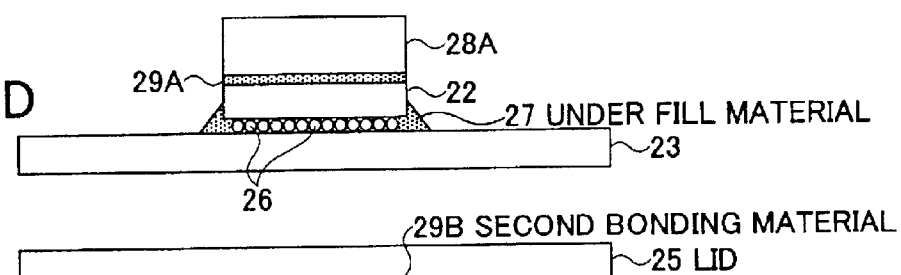

When the semiconductor chip 22 is bonded to the substrate 23 as described above, an under fill material 27 is implemented in between the semiconductor chip 22 and the substrate 23 so as to support the bumps 26. FIG. 6(D) shows the state in which the under fill material 27 is implemented.

Figure 6E:
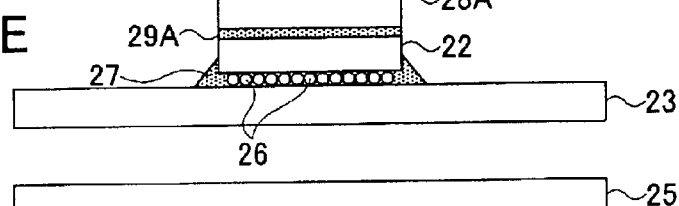

Next, a second bonding material 29B is implemented on the upper surface of the stiffener 28A so as to bond the lid 25. As for the material of the second bonding material 29B, for example, Ag paste may be used. FIG. 6(E) shows the state in which the second bonding material 29B is implemented on the upper surface of the stiffener 28A. In the following descriptions, the melting point of the second bonding material 29B is denoted as T2.

Figure 6F:
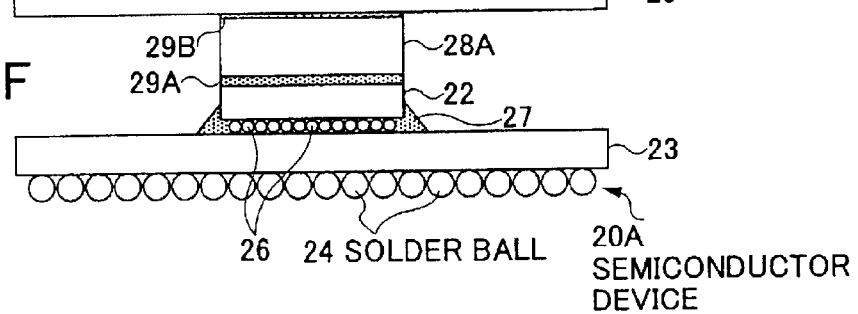

After the bonding material 29B is implemented on the stiffener 28A as described above, the lid 25 is bonded to the stiffener 28A via the second bonding material 29B. Specifically, the lid 25 is bonded to the stiffener 28A in an environment where the temperature is raised to the melting point T2 of the second bonding material 29B. In this way the semiconductor device 20A is manufactured as shown in FIG. 6(F).

The following description concerns the relation between the melting point T1 of the first bonding material 29A, the melting point T2 of the second bonding material 29B, and the melting point Tb of the bumps 26. In the present embodiment, the appropriate material is selected for each of the bonding material 29A, 29B and the bumps 26 so that their melting points have the following relationship: T1>Tb>T2.

By arranging each of the melting points T1, T2, and Tb to have the above relationship, the first bonding material 29A and the bumps 26 will not melt upon the bonding of the lid 25 to the stiffener 28A via the second bonding material 29B. Also, the first bonding material will not melt upon the bonding of the semiconductor chip 22 to the substrate 23 via the bumps 26.

Thus, the process of bonding the semiconductor chip 22 to the substrate 23 and the process of bonding the lid 25 to the stiffener 28A are performed with the stiffener 28A being securely bonded to the semiconductor chip 22 by the first bonding material 29A; in other words, with the semiconductor chip 22 being securely supported by the stiffener 28A so as to avoid deformation. In this way, each of the above bonding processes can be performed with accuracy and high reliability can be achieved in the semiconductor device 20A.

Also, as described above, in the present embodiment, the semiconductor chip 22 is bonded to the substrate 23 with the stiffener 28A being implemented in order to prevent the deformation of the semiconductor chip 22. In this way, warping can be prevented from occurring in the semiconductor chip 22 upon its bonding to the substrate 23.

Thus, in bonding the lid 25 to the stiffener 28A, the lid 25 is bonded to a stiffener 28A that is not warped. In this way, internal stress and voids can be prevented from being generated in the second bonding material 29B placed in between the lid 25 and the stiffener 28A upon the bonding process. As a result, the lid 25 and the stiffener 28A can be bonded with accuracy and high reliability can be achieved in the semiconductor device 20A.

Also, since internal stress and voids can be prevented from being generated in the second bonding material by means of the above-described arrangement, the stiffener 28A can be made thinner. In this way, the thermal conductivity of the stiffener 28A can be raised and the heat generated in the semiconductor chip 22 can be efficiently transferred via the stiffener 28A and the second bonding material 29B.

In the following, a description of modified versions of the semiconductor device 20A is given.

FIGS. 7 through 10 illustrate the above modified versions of the semiconductor device 20A. It should be noted that in each of the above drawings, the same numerical notations are assigned to the elements that are the equivalents of the elements shown in FIGS. 4 through 6 and their descriptions are omitted.

Figure 7:
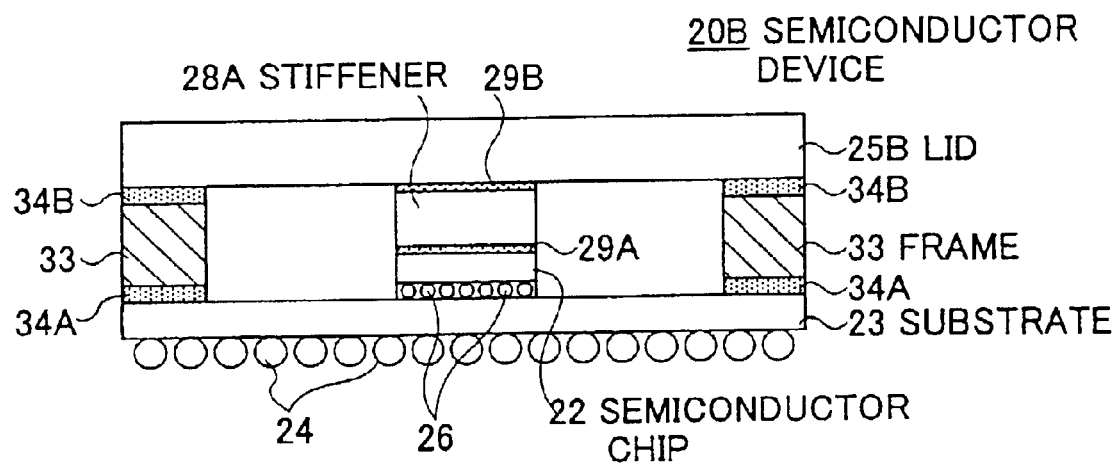
FIG. 7 is a diagram for illustrating the first modification of the semiconductor device shown in FIG. 4.

FIG. 7 shows a semiconductor device 20B, which is a first modification of the semiconductor device 20A. The semiconductor device 20B shown in this drawing has a frame 33, which supports the lid 25, placed at the outer perimeter of the substrate 23. The lower surface of this frame 33 is bonded to the substrate 23 with adhesive 34A, and the upper surface of the frame 33 is bonded to the lid 25 with adhesive 34B.

By implementing the frame 33, the lid 25 receives support not only from the semiconductor chip 22 but also from the frame 33, thereby enabling a reduction in the load applied to the semiconductor chip 22. Also, it is possible to implement other electronic devices (not shown) such as a condenser in between the semiconductor chip 22 and the frame 33.

Figure 1:
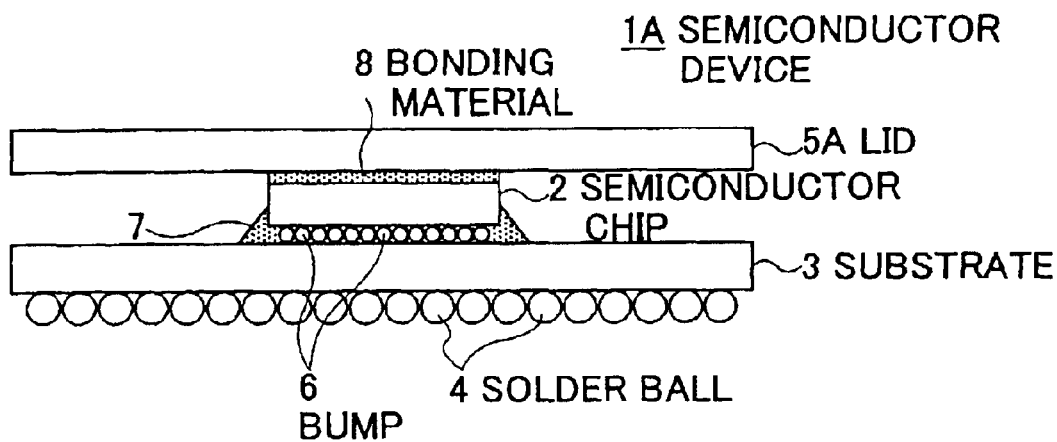
FIG. 1 shows a semiconductor device according to the conventional art (version 1)
Figure 2:
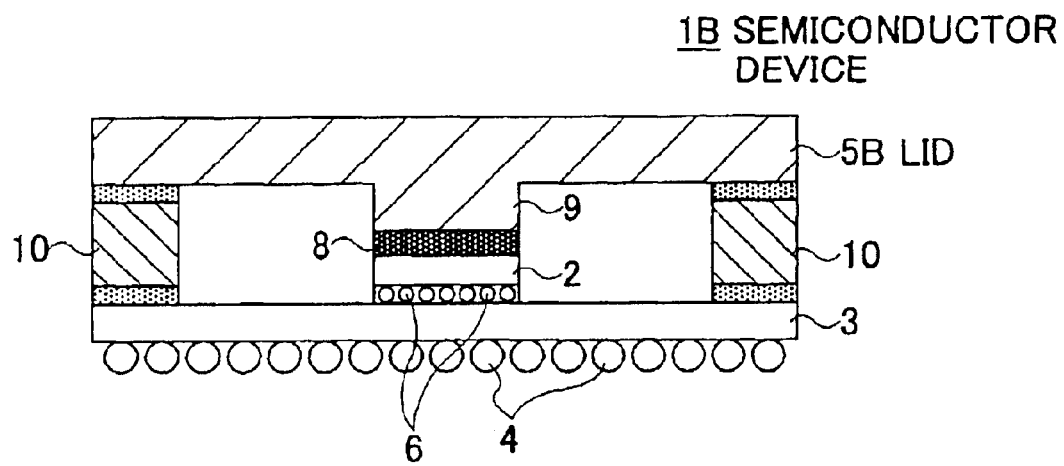
FIG. 2 shows a semiconductor device according to the conventional art (version 2)
Figure 3:
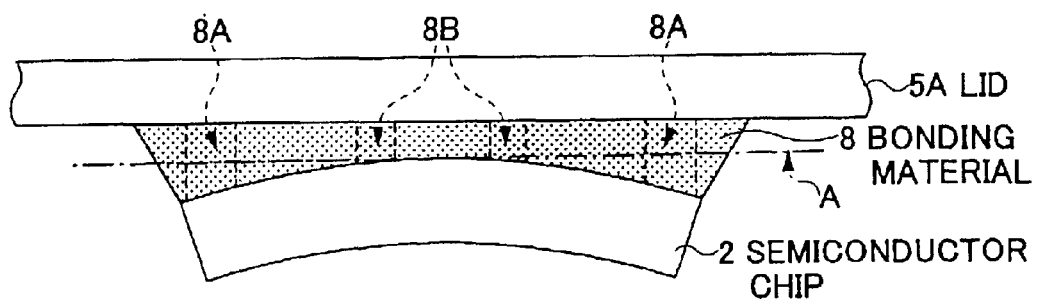
FIG. 3 is a diagram for illustrating the problems arising in the conventional art.

In the conventional semiconductor device 1B shown in FIG. 2, the protrusion 9 has to be formed as a part of the lid 5B, and this requirement causes various complications in the formation of the above lid 5B. However, in the embodiment of the present invention, the stiffener 28A is equipped with functions equivalent to that of the protrusion 9; therefore the lid 25 can be flat-shaped without any protrusions. By eliminating the necessity to form a protruding portion in the lid 25, the manufacturing process of the semiconductor device 20B can be facilitated.

Figure 8:
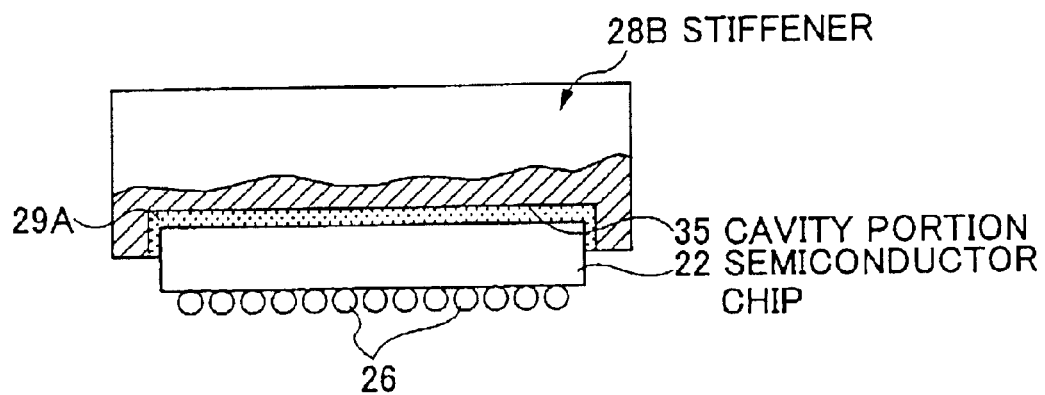
FIG. 8 is a diagram for illustrating the second modification of the semiconductor device shown in FIG. 4.

FIG. 8 is an enlarged diagram of a stiffener 28B implemented in a second modified semiconductor device. In this modification, the stiffener 28B has a cavity 35 (a concave portion) into which a part of the upper portion of the semiconductor chip 22 is inserted. By forming the cavity 35 in the stiffener 28B, the positioning of the semiconductor chip 22 and the stiffener 28B can be facilitated when bonding these two elements together. Also, since the bonded area between the semiconductor chip 22 and the stiffener 28B is increased, the bonding can be strengthened.

Figure 9:
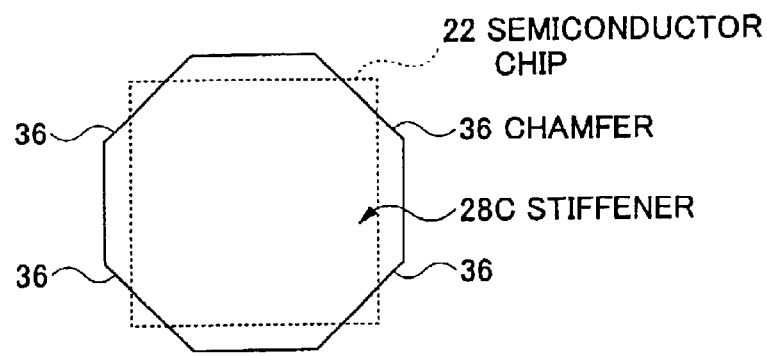
FIG. 9 is a diagram for illustrating the third modification of the semiconductor device shown in FIG. 4; and, FIG. 10 is a diagram for illustrating the fourth modification of the semiconductor device shown in FIG. 4.

FIG. 9 is an enlarged top view diagram of a stiffener 28C implemented in a third modified semiconductor device. In this modification, the stiffener 28C has chamfers 36 formed at its four corners. Thus, the stiffener 28C is octagon-shaped when viewed from the top.

Since the corners of the semiconductor chip 22 are approximately right-angled, they are prone to stress concentration. The chamfers of the stiffener 28C are formed at positions corresponding to the above corners of the semiconductor chip 22 where the stress is likely to be concentrated.

Thus, when stress is generated in the first bonding material 29A placed between the semiconductor chip 22 and the stiffener 28C, the concentration of the stress on the corners of the semiconductor chip 22 can be avoided. In turn, damage such as cracks can be prevented from occurring in the first bonding material, especially in the areas corresponding to the corners of the semiconductor chip 22.

Figure 10:
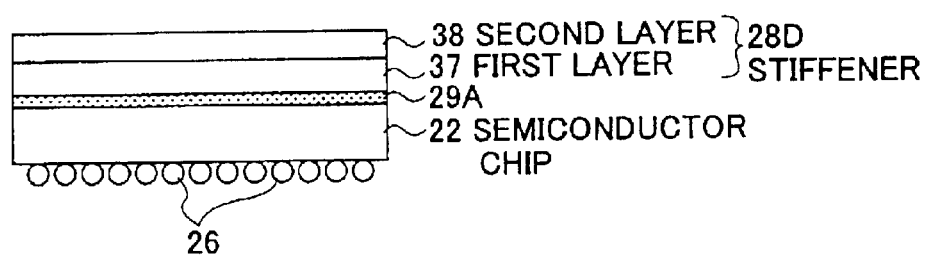

FIG. 10 is an enlarged diagram of a stiffener 28D implemented in a semiconductor device according to a fourth modification. In this modification, the stiffener 28D comprises multiple stiffener layers (2 layers are shown in FIG. 10, referred to as first layer 37 and second layer 38).

By forming the stiffener 28D so as to have a first layer 37 and a second layer 38, the characteristics of the stiffener 28D may vary for each layer. Thus, for example, for the first layer 37, which is implemented on the side facing the semiconductor chip 22, a layer having characteristics similar to those of the semiconductor chip 22 may be selected, and for the second layer 38, which is implemented on the side facing the lid 25, a layer having characteristics similar to those of the lid 25 may be selected. Thus, the bonding of the stiffener 28D to the semiconductor chip 22 and the lid 25 can be strengthened, thereby preventing deformation such as warping from occurring in the semiconductor chip 22 and the lid 25.

In the following, the various effects that can be achieved by the above-described invention are described.

According to the present invention, internal stress and voids are prevented from being generated in the bonding material placed in between the lid and the stiffener; therefore, the lid and the stiffener can be securely bonded and a higher reliability in the manufactured semiconductor device can be achieved. Also, the bonding material can be made thinner, thereby improving the thermal conductivity of the bonding material layer and enabling the efficient dissipation of heat generated at the semiconductor chip and transferred via the stiffener and the bonding material.

Also, according to the present invention, deformation such as warping in the stiffener or the semiconductor chip, or in both of these elements owing to the difference in the thermal expansion rate between the stiffener and the semiconductor chip would not occur even when heat is applied, thereby enabling a secure bonding between the stiffener and the lid and improving the reliability in the manufactured semiconductor device.

Additionally, according to the present invention, the bonding process of the semiconductor chip to the substrate and the bonding process of the lid are performed with the stiffener being securely bonded to the semiconductor chip by the first bonding material; therefore, deformation such as warping in the semiconductor chip can be avoided and higher reliability in the semiconductor device can be achieved.

Further, according to the present invention, a multi-chip module having excellent thermal dissipation characteristics as well as high reliability can be realized by implementing a plurality of the semiconductor devices on a motherboard.

What is claimed is:

1. A semiconductor device comprising:
    a semiconductor chip provided with bumps;
    a stiffener bonded to said semiconductor chip with a first bonding material and preventing the deformation of said semiconductor chip;
    a substrate on which said semiconductor chip is mounted via said bumps; and,
    a lid bonded to said stiffener with a second bonding material, wherein:
        the melting point of the first bonding material denoted as T1, the melting point of the bumps denoted as Tb, and the melting point of the second bonding material denoted as T2 are arranged to have a relationship of T1>Tb>T2.

2. The semiconductor device as claimed in claim 1, wherein the stiffener is made of a material that has substantially the same coefficient of thermal expansion as that of the semiconductor chip.

3. The semiconductor device as claimed in claim 1, wherein the stiffener has a concave portion for inserting a portion of the semiconductor chip.

4. The semiconductor device as claimed in claim 1, wherein chamfers are formed at the corners of the stiffener.

5. The semiconductor device as claimed in claim 1, wherein the stiffener is composed of a plurality of stiffener layers.

6. A semiconductor device unit comprising:
    a motherboard; and,
    a plurality of semiconductor devices arranged on the motherboard, each semiconductor device having a semiconductor chip provided with bumps, a stiffener bonded to the semiconductor chip by a first bonding material and preventing the deformation of the semiconductor chip, a substrate on which the semiconductor chip is mounted via the bumps, and a lid bonded to said stiffener with a second bonding material, wherein the melting point of the first bonding material denoted as T1, the melting point of the bumps denoted as Tb, and the melting point of the second bonding material denoted as T2 are arranged to have a relationship of T1>Tb>T2.

* * * * *